United States Patent
Chiu et al.

(10) Patent No.: US 8,488,810 B2
(45) Date of Patent: Jul. 16, 2013

(54) AUDIO PROCESSING CHIP AND AUDIO SIGNAL PROCESSING METHOD THEREOF

(75) Inventors: Sheng-Nan Chiu, Hsinchu (TW); Ching-Hsian Liao, Hsinchu County (TW); Po-Chiang Wu, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 276 days.

(21) Appl. No.: 12/757,030

(22) Filed: Apr. 8, 2010

(65) Prior Publication Data

US 2010/0266144 A1    Oct. 21, 2010

(30) Foreign Application Priority Data

Apr. 16, 2009   (TW) .............................. 98112638 A

(51) Int. Cl.
*H03G 7/00*   (2006.01)
*H03G 3/00*   (2006.01)

(52) U.S. Cl.
USPC .......................................... 381/106; 381/109

(58) Field of Classification Search
USPC ........... 381/104, 106, 321, 68.3, 109; 330/10, 330/207 A, 251
See application file for complete search history.

(56) References Cited

U.S. PATENT DOCUMENTS

| | | | |
|---|---|---|---|
| 6,240,191 B1 * | 5/2001 | Yoon | 381/109 |
| 2002/0167354 A1 * | 11/2002 | Stanley | 330/10 |
| 2004/0217808 A1 * | 11/2004 | Kim et al. | 330/10 |
| 2005/0083116 A1 * | 4/2005 | Risbo et al. | 330/10 |
| 2006/0140090 A1 * | 6/2006 | Morishima | 369/47.52 |
| 2007/0058711 A1 * | 3/2007 | Risbo | 375/238 |
| 2008/0297382 A1 * | 12/2008 | Risbo | 341/53 |

* cited by examiner

*Primary Examiner* — Fan Tsang
*Assistant Examiner* — Eugene Zhao
(74) *Attorney, Agent, or Firm* — McClure, Qualey & Rodack, LLP

(57) ABSTRACT

An audio processing chip includes a connecting port, an audio amplifier module and a pulse width modulation (PWM) control circuit. The connecting port receives a pulse width modulation (PWM) signal; the audio amplifier module amplifies an audio signal according to a control signal to thereby output an audio output signal; and the pulse width modulation (PWM) control circuit is coupled between the connecting port and the audio amplifier module, and outputs the control signal to the audio amplifier module according to the PWM signal to thereby control an operation of the audio amplifier module.

5 Claims, 5 Drawing Sheets

AUDIO PROCESSING CHIP AND AUDIO SIGNAL PROCESSING METHOD THEREOF

BACKGROUND OF THE INVENTION

1. Field of the Invention

The present invention relates to gain control of a power amplifier, and more particularly, to an audio processing chip for controlling an audio power amplifier therein, and an audio signal processing method thereof.

2. Description of the Prior Art

Audio power amplifiers are circuits commonly used in modern electronic devices. Volume control of the audio power amplifier embraces: dynamically switching the audio power amplifier between a mute mode and an unmute mode according to user commands; and, when the audio power amplifier operates under the unmute mode, executing a volume control operation to adjust the output magnitude of the audio power amplifier according to the requirements of the user.

The volume control of the audio power amplifiers can be realized via selectively adopting different control interfaces each corresponding to different specifications. For instance, digital control interfaces complying with Serial Peripheral Interface (SPI) specification, Inter Integrated Circuit (I2C) specification, or Audio Codec 97 (AC' 97) specification can be used as the interface between a host and a slave including the audio power amplifier for transmitting the control signal to the control circuit via the applied digital control interface to control the operations of the audio power amplifier accordingly. However, the usable digital control interfaces for the aforementioned volume control require more than two connecting ports to connect the host with the audio amplifier circuit having the audio power amplifier; in addition, for the audio power amplifier, complicated signal transformation required for transmitting control signals to the audio amplifier circuit correctly according to the specification with which the control interface complies is unduly bulky and complex.

Another volume control method for the audio power amplifier controls the volume via analog signals at a DC level. Please refer to FIG. 1; FIG. 1 is a block diagram illustrating a conventional audio power amplifying circuit 100. As shown in FIG. 1, the audio power amplifier 130 receives audio signals from an input signal port 106; wherein a control circuit—e.g., a Micro-Controller Unit (MCU)—inside the host 190 generates an analog signal at a DC level and transmits the generated analog signal to the audio power amplifying circuit 100 via a first connecting port of the host 190 and a first connecting port 102 of the audio power amplifying circuit 100.

For volume control of the conventional audio power amplifying circuit 100, the audio power amplifying circuit 100 further needs to be equipped with an analog-to-digital converter (ADC) 110 for converting the received analog signal (from the first connecting port 102) into a digital signal; a gain control circuit 120 then receives the digital signal to thereby adjust a gain value of an audio power amplifier 130 for modulating the output volume. However, in addition to the aforementioned first connecting port 102 and the input signal port 106, the conventional audio power amplifying circuit 100 further requires an extra port for receiving the switching signal which selectively switches the audio power amplifier 130 between the mute mode and the unmute mode. For example, when there is no demand for hearing the audio output signal, the audio power amplifier 130 will go into the mute mode according to a control signal from the host 190; that is, an additional mute control signal generated by the host 190 is required wherein the host 190 transmits the mute control signal to the audio power amplifying circuit 100 via a second connecting port 192 of the host 190 and a second connecting port 104 of the audio power amplifying circuit 100. For the audio power amplifying circuit 100, the received mute control signal controls a switch 140 to be connected or disconnected; when the mute control signal controls the switch 140 to be connected, the audio signal received via the input signal port 106 will successfully be input into the audio power amplifier 130 to thereby amplify the audio signal according to the current gain value to output an audio output signal for driving a broadcasting device (e.g., a horn or a earphone); when the mute control signal controls the switch 140 to be disconnected, the audio signal received via the input signal port 108 will not be input to the audio power amplifier 130 and thereby the audio power amplifier 130 does not perform an amplifying operation and outputs no signals for maintaining the mute mode. In short, the audio power amplifier 130 selectively switches between the mute mode and the unmute mode according to the user commands via the connection or disconnection of the switch 140.

In addition, another existing volume control method is a mechanical method which generates an analog signal at the DC level via a variable resistance, which is then used to adjust a gain value of the audio power amplifier 130; however, the ADC is still required for converting the analog signal into a digital signal, which is transmitted to the audio power amplifier 130 for controlling the volume of the output audio.

The ADC 110 is an analog circuit where, under different manufacturing processes, the corresponding ADC 110 for the audio power amplifying circuit 100 differs; furthermore, the testing for the ADC 110 is excessively complex which increases the inconvenience of the overall design. In other words, circuit designs combining analog circuits with digital circuits lead to disadvantages both of design and manufacturing.

For conventional circuits, the audio power amplifying circuit usually requires at least two extra connecting ports (e.g., the first connecting port 102 and the second connecting port 104) other than the input signal port 106 which receives the input audio; the extra connecting ports are used, respectively, wherein one of the connecting ports receives the control signal to control the gain value of the audio power amplifier 130, and the other connecting port receives the mute control signal for switching the audio power amplifier 130 between the mute mode and the unmute mode.

Therefore providing a novel volume control method and corresponding circuit is necessary.

SUMMARY OF THE INVENTION

It is one objective of the present invention to provide an audio processing chip, a control circuit for controlling the audio amplifier module and a control method thereof, to control operations of the audio amplifier module such as volume (magnitude) control and the switching between the mute mode and unmute mode in a simple way, and to solve the problems inherent in the conventional control methods.

According to an exemplary embodiment of the present invention, an audio processing chip is provided. The audio processing chip includes a connecting port and a pulse width modulation (PWM) control circuit. The connecting port receives a PWM signal, and the PWM control circuit is coupled to the connecting port, for outputting at least a control signal to an audio amplifier module to control the operation of the audio amplifier module according to the PWM signal.

According to another exemplary embodiment of the present invention, an audio processing method is provided. The audio processing method includes: receiving a pulse width modulation (PWM) signal; and outputting a control signal to an audio amplifier module according to the PWM signal for controlling the operation of the audio amplifier module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
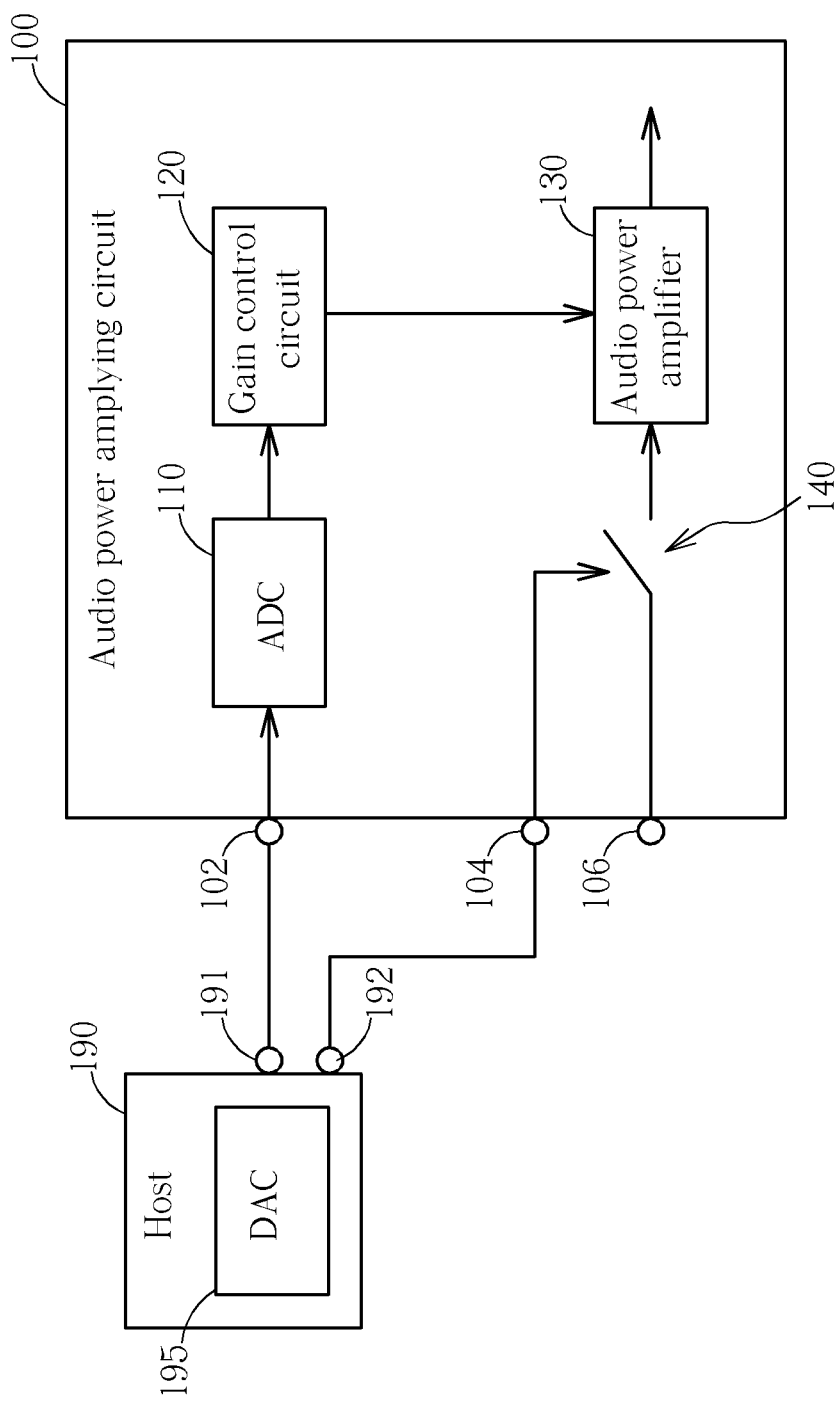
FIG. 1 is a block diagram illustrating a conventional audio power amplifying circuit.
Figure 2:
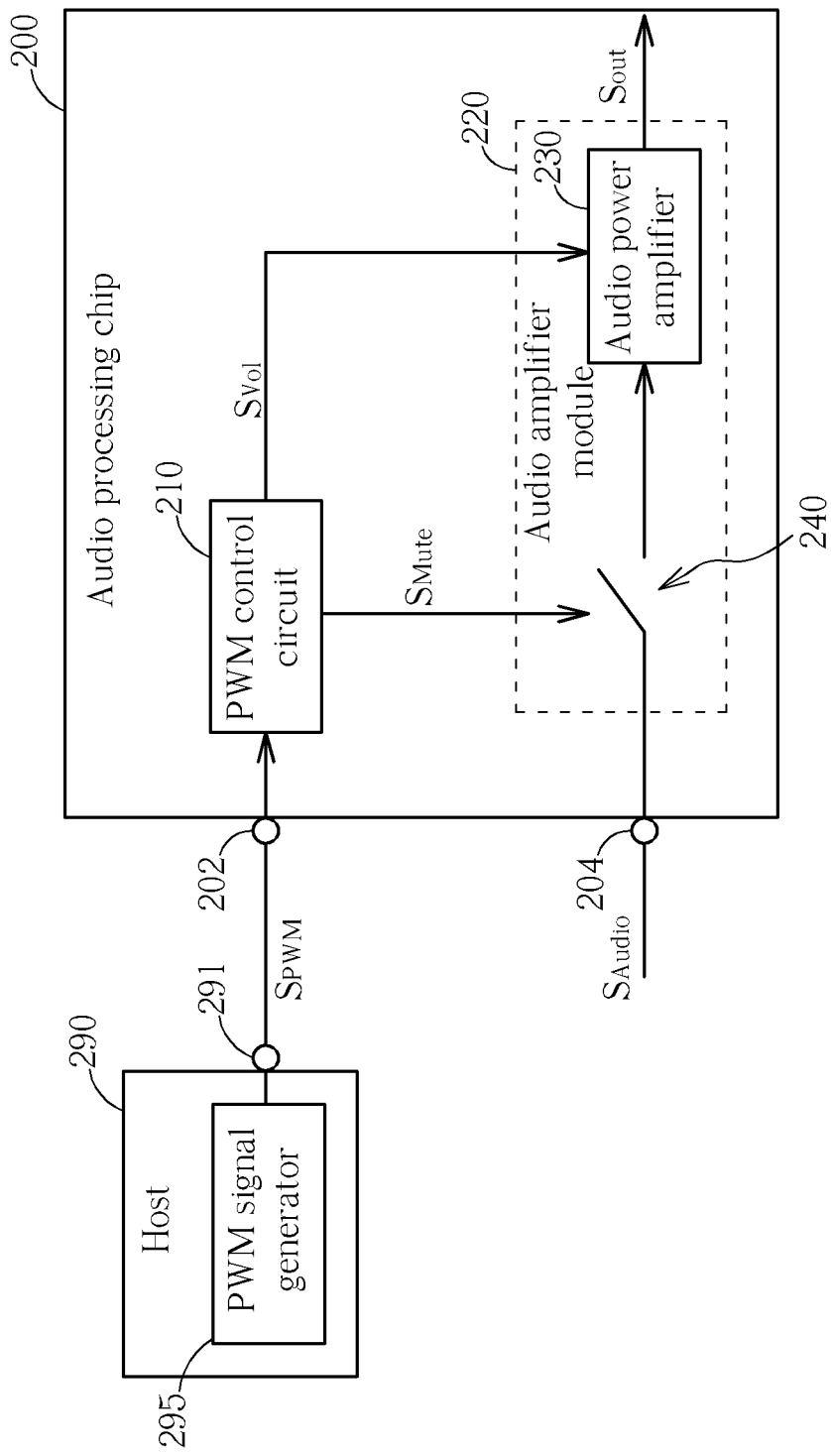
FIG. 2 is a block diagram illustrating an exemplary embodiment of an audio processing chip of the present invention.

Please refer to FIG. 2; FIG. 2 is a block diagram illustrating an exemplary embodiment of an audio processing chip 200 of the present invention. In this exemplary embodiment, the audio processing chip 200 includes a pulse width modulation (PWM) control circuit 210 and an audio amplifier module 220. The PWM control circuit receives a PWM signal $S_{PWM}$ generated by the host 290 via a connecting port 291 of the host 290 and a connecting port 202 of the audio processing chip 200; and the host 290 includes a PWM signal generator 290 which generates the PWM signal $S_{PWM}$ according to user commands (such as mute/unmute commands or volume (magnitude) commands) and transmits the PWM signal $S_{PWM}$ to the audio processing chip 200.

Contrary to the operation of the conventional audio amplifying circuit, the audio processing chip 200 uses a single connecting port 202 for receiving the PWM signal $S_{PWM}$; via the PWM signal $S_{PWM}$, the PWM control circuit 210 can generate a volume control signal $S_{VOL}$ for controlling the gain value of the audio power amplifier 230, and generate a mute switching signal $S_{MUTE}$ for switching the audio power amplifier 230 between the mute/unmute mode according to the PWM signal $S_{PWM}$. For instance, when the audio processing chip 200 starts to receive the PWM signal $S_{PWM}$, the PWM control circuit 210 outputs the mute switching signal $S_{MUTE}$ to the switch 240 according to the PWM signal $S_{PWM}$ to turn the switch 240 from a predetermined disconnected state into a connected state; since the switch is coupled between a signal port 204 and the audio power amplifier 230 for transmitting the audio signal $S_{Audio}$ from the connecting port 204 to the audio power amplifier 230, when the audio processing chip 200 receives the PWM signal $S_{PWM}$, the PWM control circuit 210 will check if the user requires hearing the audio output signal or not according to the signal level of the PWM signal $S_{PWM}$, and selectively switches the audio amplifier module 220 from the mute mode (i.e., the switch 240 is disconnected) into the unmute mode (i.e., the switch 240 is connected). More clearly, the audio processing chip 200 determines that there is no requirement for broadcasting the audio signal when there is a time period without signal pulse (no logic level transitions) in the PWM signal $S_{PWM}$, the audio processing chip 200 will indicate that the output audio is required if in a certain period of time with a plurality of pulses (or logic level transitions) in the PWM signal $S_{PWM}$.

In addition, for the volume (magnitude) control, the PWM control circuit 210 generates the volume adjusting signal $S_{Vol}$ according to the duty cycle of the received PWM signal $S_{PWM}$ to dynamically adjust the gain value of the audio power amplifier 230 for outputting the audio output Sout according to user requirements. That is, the PWM control signal 210 executes operations upon the PWM signal $S_{PWM}$ for adjusting the volume adjusting signal $S_{Vol}$ according to variations of the duty cycles of the PWM signal $S_{PWM}$, wherein the variation of the volume adjusting signal $S_{Vol}$ leads to changes of configurations in the audio power amplifier 230 to thereby adjust the gain value of the audio power amplifier 230. Since the operations for adjusting the gain values of the audio power amplifier 230 are well-known by people skilled in this art, detailed descriptions are omitted here for the sake of brevity. In this exemplary embodiment, the longer the duty cycle (e.g., the ratio that stays at the logic level "1" in a same period) of the PWM signal $S_{PWM}$, the larger the gain value of the audio power amplifier 230 set for increasing the volume magnitude of the output audio; due to the switch 240 being controlled to switch into a connecting state (unmute mode) when the PWM control circuit 210 receives the PWM signal $S_{PWM}$, the audio processing chip 200 is capable of adjusting the received audio signal according to the duty cycle of the PWM signal $S_{PWM}$ to generate the required output signal to a broadcasting device (e.g., a horn or an earphone) according to user demands.

By applying the features of the present invention, the audio processing chip 200 requires a single connecting port 202 for receiving the controls corresponding to the volume (magnitude) control and the mute/unmute switching from the host 290. Compared to the conventional volume control methods, at least one connecting port is saved; furthermore, the difficulty of corresponding testing processes and manufacturing processes is excessively eased since there are no more requirements for an ADC to convert signals from an analog manner into a digital manner. However, please note that the audio processing chip 200 may include more circuit elements and the circuit elements illustrated in FIG. 2 are for illustrative purposes only and are not meant to be limitations of the present invention. That is, the audio processing chip 200 may include other circuit elements, and these design variances obey and fall within the scope of the present invention. The detailed operations of the PWM control circuit 210 are disclosed as follows.

Figure 3:
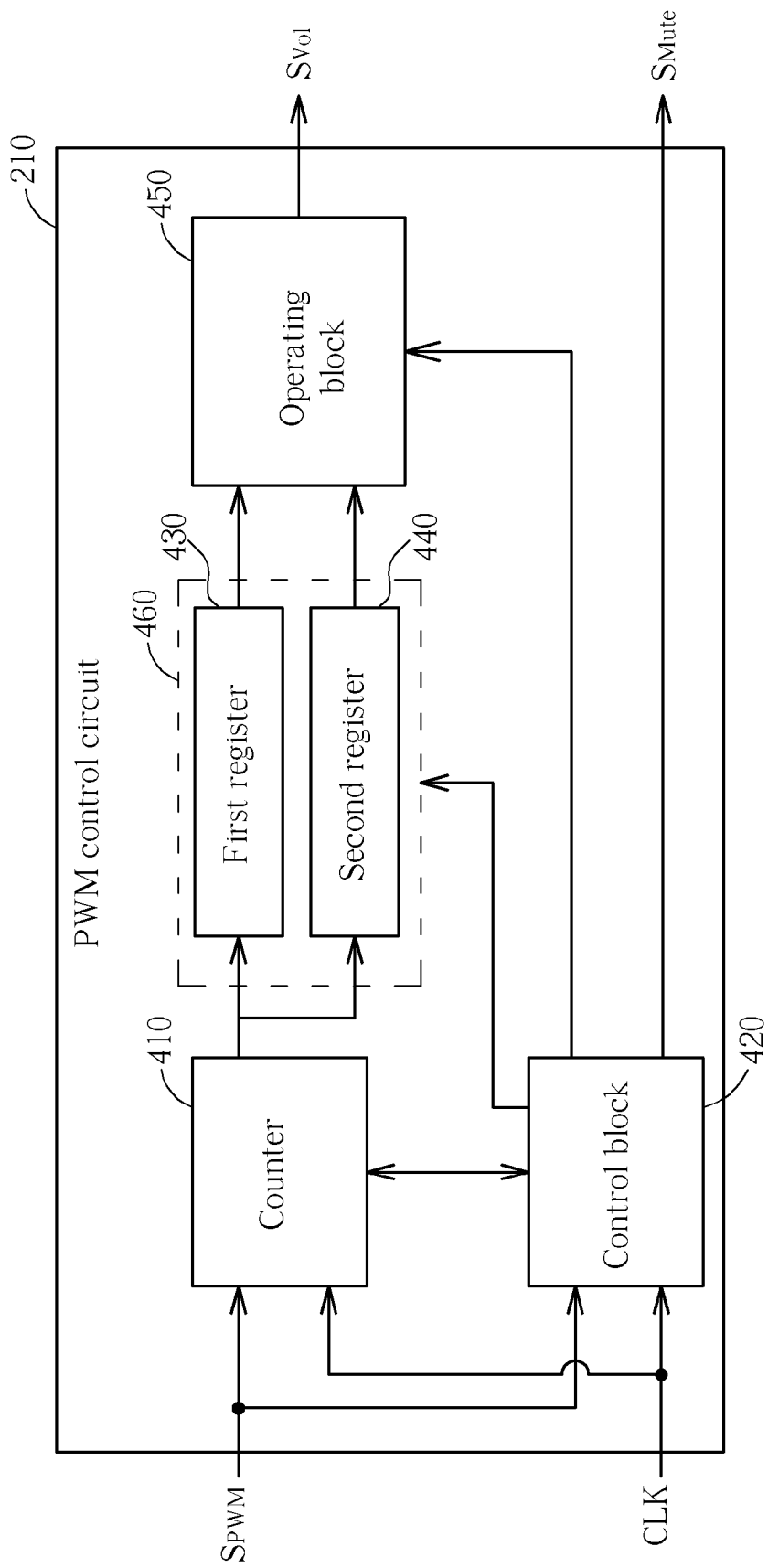
FIG. 3 is a block diagram illustrating an exemplary embodiment of the PWM control circuit shown in FIG. 2.
Figure 4:
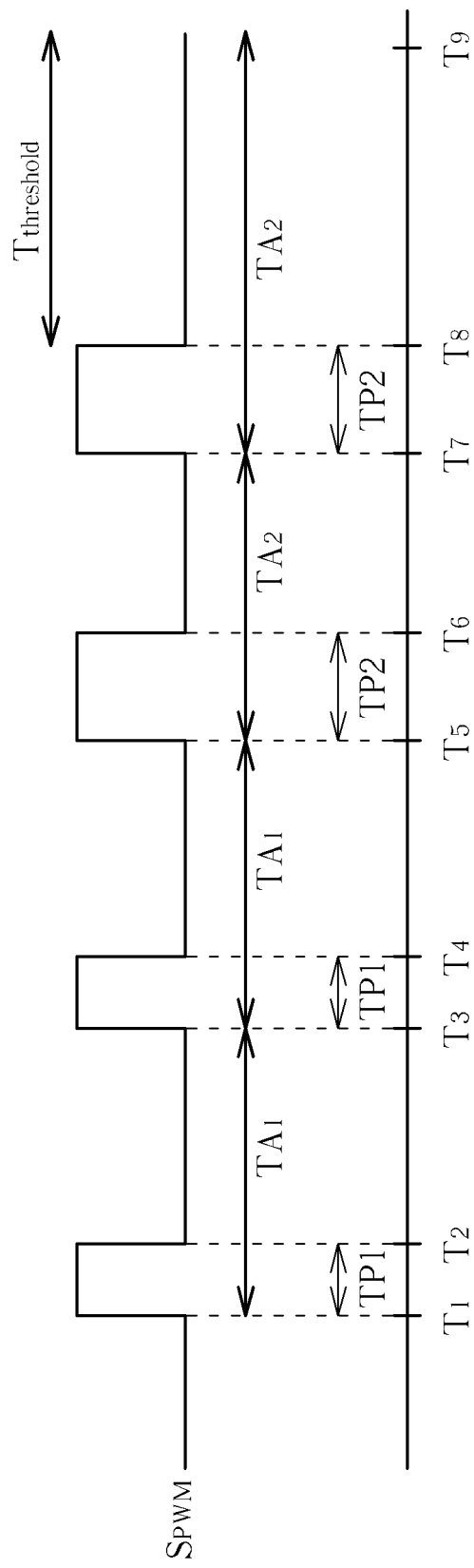
FIG. 4 is an exemplary embodiment of signal states of the PWM signal received by the PWM control circuit.

Please refer to FIG. 3 and FIG. 4 in conjunction with FIG. 2. FIG. 3 is a block diagram illustrating an exemplary embodiment of the PWM control circuit 210 in FIG. 2. FIG. 4 is an exemplary embodiment of signal states of the PWM signal $S_{PWM}$ received by the PWM control circuit 210. As shown in FIG. 3, the PWM control circuit 210 includes (but is not limited to) a counter 410, a control module 420, a first register 430, a second register 440 and an operating module 450. In this embodiment, under a default state, the mute switching signal $S_{Mute}$ outputted from the control module 420 sets the audio amplifier module 220 at a mute mode; that is, initially, the mute switching signal $S_{Mute}$ disconnects the switch 240 to make the audio signal unavailable to the audio power amplifier 230.

As shown in FIG. 4, before $T_1$, the PWM signal $S_{PWM}$ maintains a default low logic level "0" since there are no pulses/logic level transitions to thereby keep the audio amplifier module 220 operating in the mute mode. At $T_1$, the PWM signal $S_{PWM}$ changes from the low logic level "0" into the high logic level "1", which leads to the control module 420 adjusting the mute switching signal $S_{Mute}$ to make the switch 240 connected, where the PWM control circuit 210 further simultaneously controls the counter 410 to start counting according to a reference clock. At $T_2$, the PWM signal $S_{PWM}$ switches from the high logic level "1" into the low logic level "0" and the control module 420 further controls the register module 460 to store the current count value $TP_1$ of the counter 410 into the first register 430.

At $T_3$, the PWM signal $S_{PWM}$ turns from the low logic level "0" into the high logic level "1", where the time from $T_1$ to $T_3$ is a complete period of the PWM signal $S_{PWM}$; at this point, the PWN control circuit 210 controls counter 410 to store the current count value $TA_1$ of the counter 410 into the second register 440, and then resets the counter 410 for clearing the count value and setting it as a default value (e.g., "0"). Additionally, the PWM control circuit 210 controls the operating module 450 to calculate a $TP_1/TA_1$ ratio for thereby obtaining a duty cycle corresponding to the first period (from $T_1$ to $T_3$) of the PWM signal $S_{PWM}$ to generate the volume adjusting signal $S_{vo1}$ to the audio power amplifier 230.

As shown in FIG. 4, the duty cycle ($TP_1/TA_1$) at the next period (from $T_3$ to $T_5$) of the PWM signal $S_{PWM}$ is identical to the duty cycle of the first period; similarly, at $T_4$ the PWM control circuit 210 also controls the counter 410 to store the current count value $TP_1$ of the counter 410 into the first register 430 for recording the time length that the PWM signal $S_{PWM}$ remains at the high logic level "1"; At $T_5$, the PWM control circuit 210 controls the counter 410 to store the current count value $TA_1$ into the second register 440 where the count value $TA_1$ indicates a time length corresponding to the second period of the PWM signal $S_{PWM}$; the PWM control circuit 210 also resets the counter 410 and controls the operating module 450 to calculate a duty cycle corresponding to the certain period ($T_3$ to $T_5$) of the PWM signal $S_{PWM}$. In this case, since the user does not adjust the wanted volume magnitude from $T_1$ to $T_5$, both the duty cycle of the PWM signal $S_{PWM}$ and the volume adjusting signal $S_{Vol}$ output by the PWM control circuit 210 remain the same. In other words, the volume magnitude outputted from the audio power amplifier 230 remains the same during the first period (from $T_1$ to $T_3$) and the second period (from $T_3$ to $T_5$).

Figure 5:
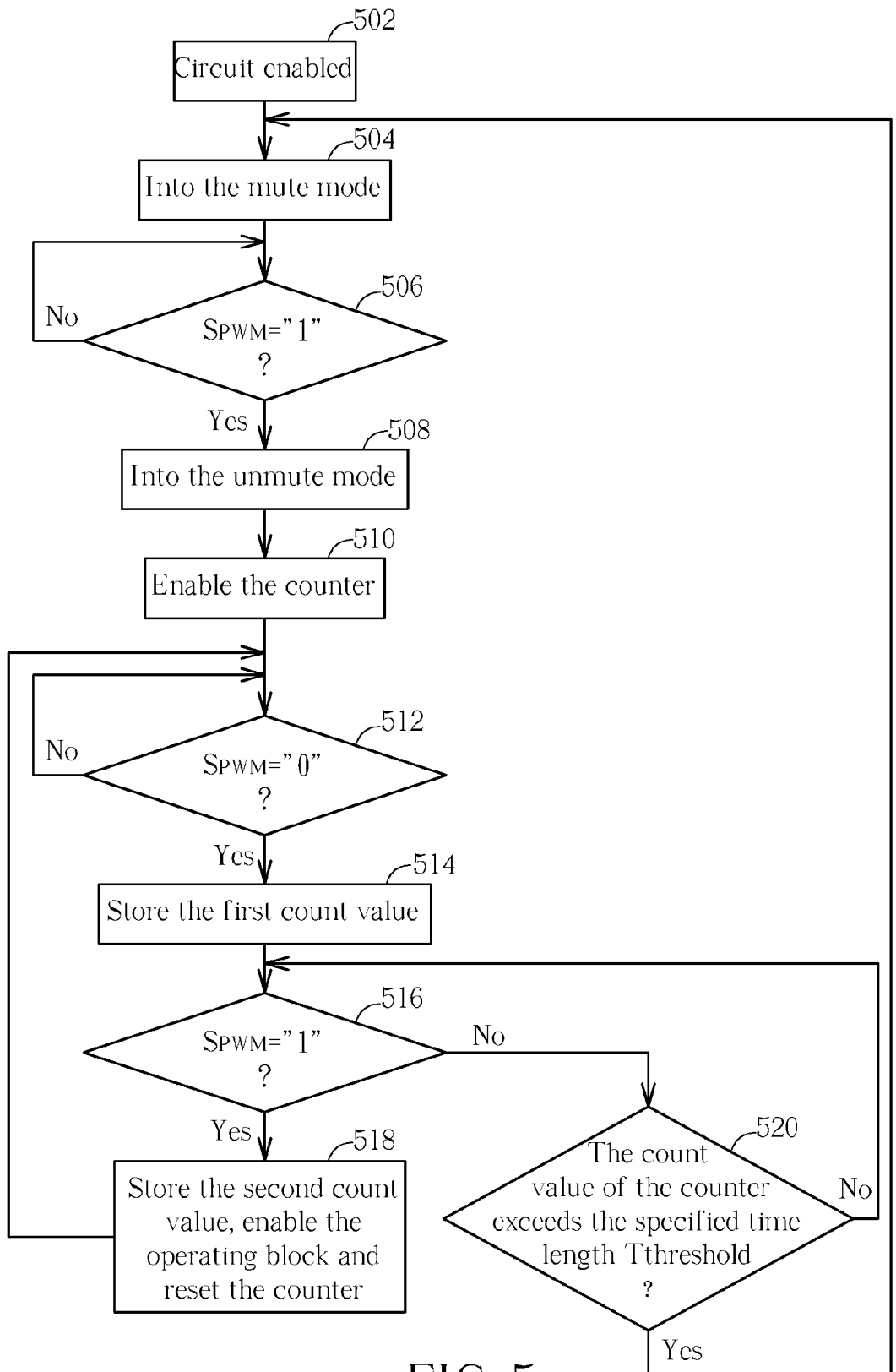
FIG. 5 is a flowchart illustrating an exemplary embodiment of an audio processing method of the present invention.

However, at $T_5$, the user wishes to adjust the volume magnitude of the output audio and thus changes the duty cycle of the PWM signal $S_{PWM}$ outputted from the hosts 290. As shown in FIG. 5, during the third period (from $T_5$ to $T_7$) of the PWM signal $S_{PWM}$, the count value stored into the first register 430 is $TP_2$ and the time length corresponding to the third period is represented as $TA_2$ which is stored into the second register 440; at $T_7$, the control module 420 resets the counter 410 and controls the operating module 450 to calculate the duty cycle (a $TP_2/TA_2$ ratio) of the PWM signal $S_{PWM}$ for adjusting the volume adjusting signal $S_{voi}$ accordingly and hence adjusts the gain value of the audio power amplifier 230.

In short, the PWM control circuit 210 generates the volume adjusting signal $S_{voi}$ by adjusting the duty cycle of the PWM signal $S_{PWM}$ to adjust the operations of the audio power amplifier 230. Moreover, when no more logic level transitions of the PWM signal $S_{PWM}$ exist; the control module 420 will control the mute switching signal $S_{Mute}$ to switch the audio amplifier module 220 from the unmute mode into the mute mode. For instance, under the unmute mode, once a time length of the PWM signal $S_{PWM}$ remaining at the low logic level "0" exceeds a specified time length $T_{threshold}$ (e.g., a count value of the counter 410 exceeds a sum of $TP_2$ and the predetermined time length), the PWM control circuit 210 adjusts the mute switching signal $S_{Mute}$ for disconnecting the switch 240 and hence stops outputting the audio signal. Length of the predetermined time length $T_{threshold}$ is for illustrative purposes only and is not meant to be a limitation of the present invention. As per the illustrated structure of the PWM control circuit 210 in FIG. 3, the PWM control circuit 210 may use different circuit elements for deriving the duty cycle of the PWM signal $S_{PWM}$ to thereby control the volume adjusting operations of the audio power amplifier module 220 and/or control the audio power amplifier 230 between the mute/unmute mode accordingly. The aforementioned design variations all obey and fall within the scope of the present invention.

Please refer to FIG. 5 in conjunction with FIG. 2; FIG. 5 is a flow chart illustrating an exemplary embodiment of the audio signal processing method of the present invention. Please note that if the result is substantially the same, the steps of the audio signal processing method are not limited to be executed according to the exact order shown in FIG. 5. The flow includes the following steps:

Step 502: Enable an audio processing chip and control the audio processing chip into a default state.

Step 504: Set the audio power amplifier module 220 into a mute mode.

Step 506: Check if the PWM signal $S_{PWM}$ changes from a predetermined second logic level (e.g., logic "0") into a first logic level (e.g., logic "1"). If yes, go to Step 508; otherwise, go to Step 504 to continue monitoring the PWM signal $S_{PWM}$.

Step 508: The PWM control circuit 210 switches the audio amplifier module 220 into the unmute mode and enables the counter 410.

Step 510: The counter starts to count.

Step 512: Check if the PWM signal $S_{PWM}$ changes from the first logic level (e.g., logic "1") into the second logic level (e.g., logic "0"). If yes, go to Step 512 to continue monitoring the PWM signal $S_{PWM}$.

Step 514: The control module 420 controls the counter 410 to store the first count value (e.g., the $TP_1/TP_2$ illustrated in FIG. 4) into the first register 430.

Step 516: Check if the PWM signal $S_{PWM}$ changes from the second logic level (e.g., the logic "0") into the first logic level (e.g., logic "1"). If yes, go to Step 518; otherwise, go to Step 520.

Step 518: The control module 420 controls the counter 410 to store a second count value (e.g., $TA_1$ illustrated in FIG. 4) into the second register 440 and controls the operating module 450 to calculate a ratio of the first counter value and the second count value (e.g., $$\frac{TP1}{TA1} \text{ or } \frac{TP2}{TA1}$$

for computing the corresponding duty cycle of the PWM signal $S_{PWM}$; and the control module 420 further resets the counter 410.

Step 520: Check if a time length that the PWM signal $S_{PWM}$ remains at a same logic level (e.g., logic "0") exceeds a predetermined time length $T_{threshold}$. If yes, go to Step 504 for switching the audio amplifier module 220 into the mute mode; otherwise; go to Step 516 for monitoring the PWM signal $S_{PWM}$.

Since the detailed operations of each step of the audio processing method are disclosed in the aforementioned descriptions corresponding to FIG. 2~FIG. 4, further descriptions are omitted here for the sake of brevity. Please note that, in an exemplary embodiment of the present invention, the operating module 450 can be implemented via a divider; in addition, the features of the present invention are an audio processing chip and operations that use a PWM signal for both the mute/unmute switching operations and the volume adjusting operations. Furthermore, the present invention also discloses a control method for the audio amplifier module wherein the PWM signal can be used to adjust the volume magnitude of the output audio and to switch the audio amplifier module between the mute mode and the unmute mode accordingly.

Those skilled in the art will readily observe that numerous modifications and alterations of the device and method may be made while retaining the teachings of the invention.

What is claimed is:

1. An audio processing chip, comprising:
   a connecting port, for receiving a pulse width modulation (PWM) signal external to the audio processing chip;
   an audio amplifier module, for amplifying an audio signal according to a mute switching signal and a volume adjusting signal to output an audio output signal accordingly; and
   a PWM control circuit, coupled between the connecting port and the audio amplifier module, for outputting the mute switching signal and the volume adjusting signal according to the PWM signal to control the audio amplifier module to operate in one of a mute mode and an unmute mode and to adjust a gain value of the audio amplifier module.

2. The audio processing chip of claim 1, wherein when the PWM control circuit detects a logic level transition of the PWM signal while the audio amplifier module is operated under the mute mode, the PWM control circuit outputs the mute switching signal for switching the audio amplifier module from the mute mode into the unmute mode; and when the PWM control circuit detects that the PWM signal stays at a logic level for a predetermined length of time while the audio amplifier module is operating under the unmute mode, the PWM control circuit outputs the mute switching signal for switching the audio amplifier module from the unmute mode into the mute mode.

3. The audio processing chip of claim 2, wherein the PWM control circuit comprises:

a counter, for calculating a time length that the PWM signal remains at a same logic level, to generate a corresponding count value accordingly; and
a control module, coupled to the counter, for outputting the mute switching signal to switch the audio amplifier module from the mute mode into the unmute mode when the PWM control circuit detects the logic level transition while the audio amplifier module is operating under the mute mode; and outputting the mute switching signal for switching the audio amplifier module from the unmute mode into the mute mode when the time length to which the counter value corresponds reaches the predetermined time length.

4. The audio processing chip of claim 1, wherein the PWM control circuit comprises:
   a counter, for generating a first count value and a second count value respectively according to a period of the PWM signal;
   a first register, coupled to the counter;
   a second register, coupled to the counter;
   an operating module, coupled to the first register and the second register; and
   a control module, coupled to the counter, the first register and the second register, for controlling the first register to register the first count value and the second register to register the second count value, and for determining a duty cycle of the PWM signal according to the first count value registered in the first register and the second count value registered in the second register, and generating the volume adjusting signal according to the duty cycle.

5. An audio processing method, comprising:
   receiving a pulse width modulation (PWM) signal external to a connecting port of an audio processing chip;
   outputting a a mute switching signal and a volume adjusting signal according to the PWM signal; and
   amplifying, by an audio amplifier module, an audio signal according to the mute switching signal and the volume adjusting signal to output an audio output signal, wherein the mute switching signal controls the audio amplifier module to operate according to one of a mute mode and an unmute mode, and wherein the volume adjusting signal controls a gain value of the audio amplifier module.

* * * * *